United States Patent
Chen et al.

(10) Patent No.: US 7,924,950 B2
(45) Date of Patent: Apr. 12, 2011

(54) METHOD AND APPARATUS OF DECODING ENCODED DATA FRAME HAVING DUMMY BIT SEQUENCES INCLUDED THEREIN

(75) Inventors: Ying-Ying Chen, Taipei (TW); Chun-Ming Kuo, Taipei County (TW)

(73) Assignee: MediaTek Inc., Science-Based Industrial Park, Hsin-Chu (TW)

( * ) Notice: Subject to any disclaimer, the term of this patent is extended or adjusted under 35 U.S.C. 154(b) by 653 days.

(21) Appl. No.: 11/936,795

(22) Filed: Nov. 8, 2007

(65) Prior Publication Data

US 2009/0122921 A1 May 14, 2009

(51) Int. Cl.
*H04L 27/06* (2006.01)
(52) U.S. Cl. ...................................................... 375/341
(58) Field of Classification Search .................. 375/262, 375/341; 704/242; 714/795
See application file for complete search history.

(56) References Cited

U.S. PATENT DOCUMENTS

| 2005/0286656 A1* | 12/2005 | Muralidhar et al. | 375/340 |
| 2006/0146757 A1* | 7/2006 | Harris | 370/335 |

FOREIGN PATENT DOCUMENTS

EP 1 873 921 A1 1/2008

* cited by examiner

*Primary Examiner* — Sam K Ahn
(74) *Attorney, Agent, or Firm* — Winston Hsu; Scott Margo

(57) ABSTRACT

A method of decoding an encoded data frame including dummy bit sequences each generated from encoding a predetermined bit pattern is provided. The method includes: determining a boundary of dummy bit sequences in the encoded data frame; and generating a decoded data frame according to a partial decoding result and a plurality of predetermined bit patterns each corresponding to one of the dummy bit sequences within the boundary, wherein the partial decoding result is generated by decoding encoded bits beyond the boundary according to the predetermined bit pattern.

24 Claims, 8 Drawing Sheets

METHOD AND APPARATUS OF DECODING ENCODED DATA FRAME HAVING DUMMY BIT SEQUENCES INCLUDED THEREIN

BACKGROUND

The present invention relates to data decoding, and more particularly, to a method and apparatus of decoding an encoded data frame (e.g., an encoded FACCH frame) including dummy bit sequences each generated from encoding a predetermined bit pattern (e.g., 0x2B from least significant bit LSB to most significant bit MSB).

In digital communication systems, the maximum likelihood decoding is a popular technique applied in numerous communication systems with different architectures. The Viterbi decoder is a generalized functional block utilizing this technique to decode the received data frame which might include errors introduced by many factors. As it is well known in the art, additive white Gaussian noise (AWGN) and many sources of interference exist in general communication channels. To reduce the error rate of signal detection, most communication systems encode the data and then transmit the encoded data instead of transmitting the original data directly. This encoding procedure comprises convoluting the data according to a specific coding algorithm, where the number of bits of the encoded data is more than the original data. For example, convolutional codes are generate by encoding the original data according to a code rate equal to k/n, where n represents the number of output bits and k represents the number of input bits. When a receiver end decodes the received encoded data, the receiver end examines the accuracy of the received encoded data by using the maximum likely-hood decoding (i.e., the Viterbi decoding) to compute a metric value for each path and then make a decision based upon the accumulated path metric values. As the Viterbi decoding is well known to those skilled in this art, further description is omitted here for the sake of brevity.

For certain communication channels in a communication system, dummy bits or filling bits are padded to the data bits to be transmitted when the data length of the data bits is shorter than a predetermined value. That is, the filling bits are added when there is not so much information to be transmitted via the communication channel. Taking the fast associated control channel (FACCH) in a GSM communication system for example, each encoded FACCH frame is composed of 456 encoded bits. Please refer to FIG. 1, which is a diagram illustrating an encoding architecture for the FACCH frame. The information source 12 provides data bits (184 bits or 23 bytes) to be transmitted via the FACCH channel. The error checking block 14 then calculates CRC bits (40 bits or 5 bytes) according to the data bits, and then adds the CRC bits following the data bits to generate a resultant data frame of 224 bits. In the end, the convolutional encoding block 16, which is configured to have a code rate of 1/2, performs a convolutional encoding according to the raw data frame (224 bits) and 4 tail bits to output a convolutional encoding result, e.g., the encoded FACCH frame. When the data length of the data bits is shorter than 184, a predetermined bit pattern of filling bits is repeatedly added until the resultant data length reaches 184. Regarding the FACCH frame, the above predetermined bit pattern is 0x2B, i.e. (1,1,0,1,0,1,0,0) from least significant bit (LSB) to most significant bit (MSB). Please refer to FIG. 2. FIG. 2 is a diagram illustrating a resultant data frame including the filling bits appended to the raw data bits.

Regarding the conventional decoder architecture, the Viterbi decoder is responsible for decoding the encoded FACCH frame having 456 bits to extract the control message carried therewith. In some situations, however, if the error bits presented in the middle of the encoded FACCH frame that is generated from encoding the filling bits might make the decoder fail to recover the raw FACCH frame from the encoded FACCH frame. As a result, the conventional Viterbi decoder discards this decoding result of the encoded FACCH frame, and then indicates a decoding failure accordingly. It should be noted that the above-mentioned encoded FACCH frame might include correct encoded bits corresponding to the raw data bits and CRC bits; however, a decoding failure may occur due to the error bits corresponding to the filling bit portion. Therefore, a method and apparatus is required to correct encoded FACCH frame containing error bits present in the filling bit portion to increase probability for successfully acquiring encoded FACCH frame.

SUMMARY OF THE INVENTION

It is therefore one of the objective of the present invention to provide a method and apparatus of decoding an encoded data frame including dummy bit sequences according to a boundary estimation result of dummy bit sequences included in the encoded data frame, thereby increasing probability of successful decoding.

According to one embodiment of the present invention, a method of decoding an encoded data frame including dummy bit sequences each generated from encoding a predetermined bit pattern is provided. The method includes: determining a boundary of dummy bit sequences in the encoded data frame; and generating a decoded data frame according to a partial decoding result and a plurality of predetermined bit patterns each corresponding to one of the dummy bit sequences within the boundary, wherein the partial decoding result is generated by decoding encoded bits beyond the boundary according to the predetermined bit pattern.

According to one embodiment of the present invention, a method of decoding an encoded data frame including dummy bit sequences each generated from encoding a predetermined bit pattern is provided. The method includes: generating an initial decoded data frame by decoding the encoded data frame; determining a boundary of dummy bit sequences in the encoded data frame; and generate an updated decoded data frame by replacing each decoded bit sequence in the initial decoded data frame that corresponds to one dummy bit sequence within the boundary with the predetermined bit pattern.

According to one embodiment of the present invention, a decoder for decoding an encoded data frame including dummy bit sequences each generated from encoding a predetermined bit pattern is provided. The decoder includes: a boundary detecting module, for determining a boundary of dummy bit sequences in the encoded data frame; a decoding module, coupled to the boundary detecting module, for decoding encoded bits beyond the boundary according to the predetermined bit pattern to generate a partial decoding result; and a control module, coupled to the boundary detecting module and the decoding module, for generating a decoded data frame according to the partial decoding result and a plurality of predetermined bit patterns each corresponding to one of the dummy bit sequences within the boundary.

According to one embodiment of the present invention, a decoder for decoding an encoded data frame including dummy bit sequences each generated from encoding a predetermined bit pattern is provided. The decoder includes: a decoding module, for generating an initial decoded data frame by decoding the encoded data frame; a boundary detecting module, for determining a boundary of dummy bit sequences in the encoded data frame; and a control module, coupled to the decoding module and the boundary detecting module, for generating an updated decoded data frame by replacing each decoded bit sequence in the initial decoded data frame that corresponds to one dummy bit sequence within the boundary with the predetermined bit pattern.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . " The terms "couple" and "couples" are intended to mean either an indirect or a direct electrical connection. Thus, if a first device couples to a second device, that connection may be through a direct electrical connection, or through an indirect electrical connection via other devices and connections.

Figure 3:
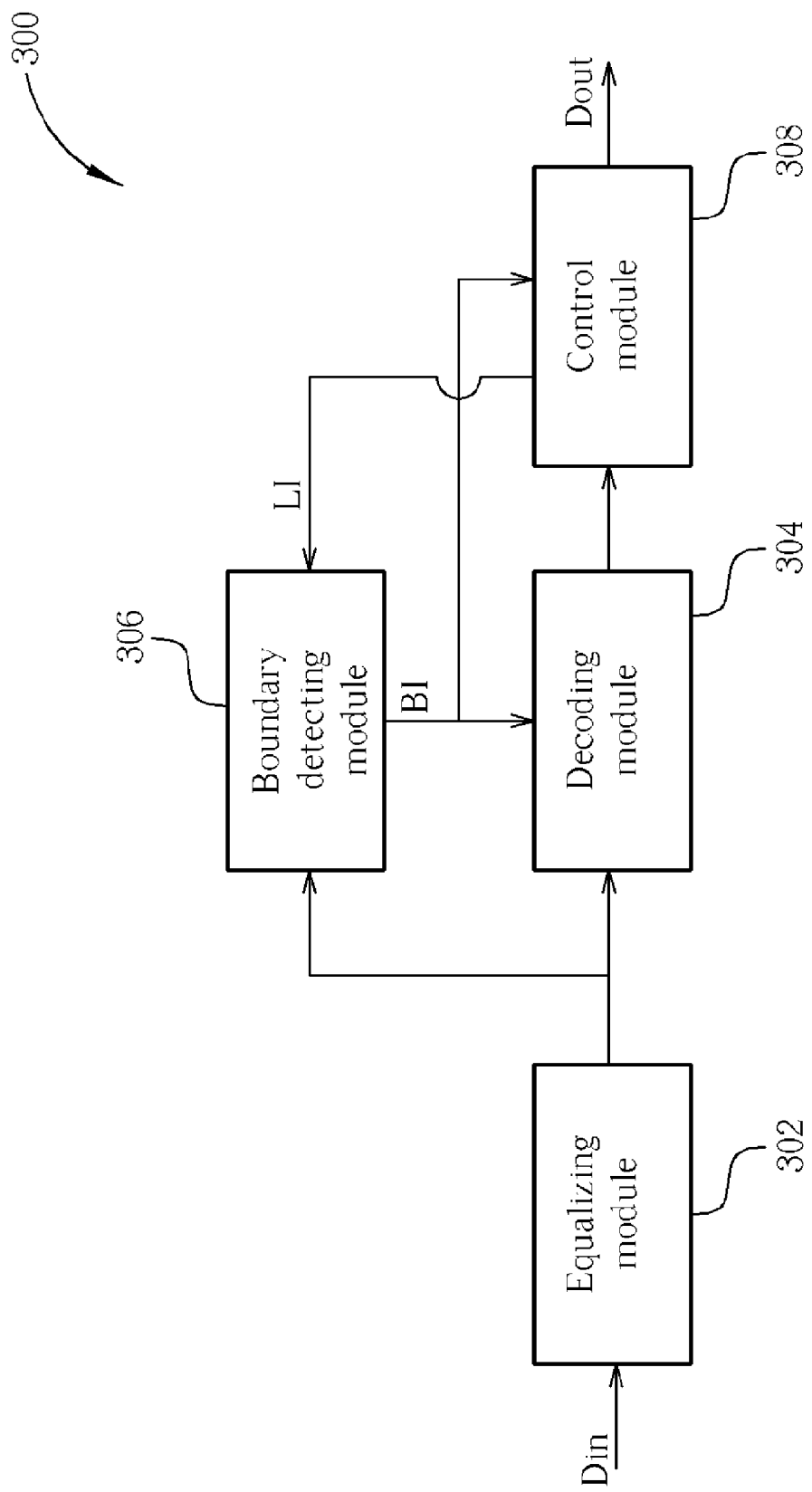
FIG. 3 is a block diagram illustrating a decoder according to an exemplary embodiment of the present invention.

FIG. 3 is a block diagram illustrating a decoder 300 according to an exemplary embodiment of the present invention. In this embodiment, the decoder 300 includes an equalizing module 302, a decoding module 304, a boundary detecting module 306, and a control module 308. Please note that only the components pertinent to the present invention are shown in FIG. 3. Additionally, the functional blocks shown in FIG. 3 can be implemented by hardware components, software components or any combinations thereof. These alternative designs all obey the spirit of the present invention. In the following description, the decoder 300 is used to decode encoded FACCH frames; however, this is for illustrative purposes only and not meant to be a limitation of the present invention.

The equalizing module 302 is implemented in an inner receiver (not shown) for processing the incoming encoded data frame $D_{in}$ and then outputting a soft decision value or a hard decision value for each bit in the encoded data frame $D_{in}$. In this embodiment, the equalizing module 302 could be realized using any conventional equalizer architecture. In other words, the equalizing module 302 is a generalized functional block containing any components required for producing the required soft decision values or hard decision values. In short, any equalizer architecture capable of providing soft decision values of the encoded data frame $D_{in}$ can be adopted.

Figure 1:
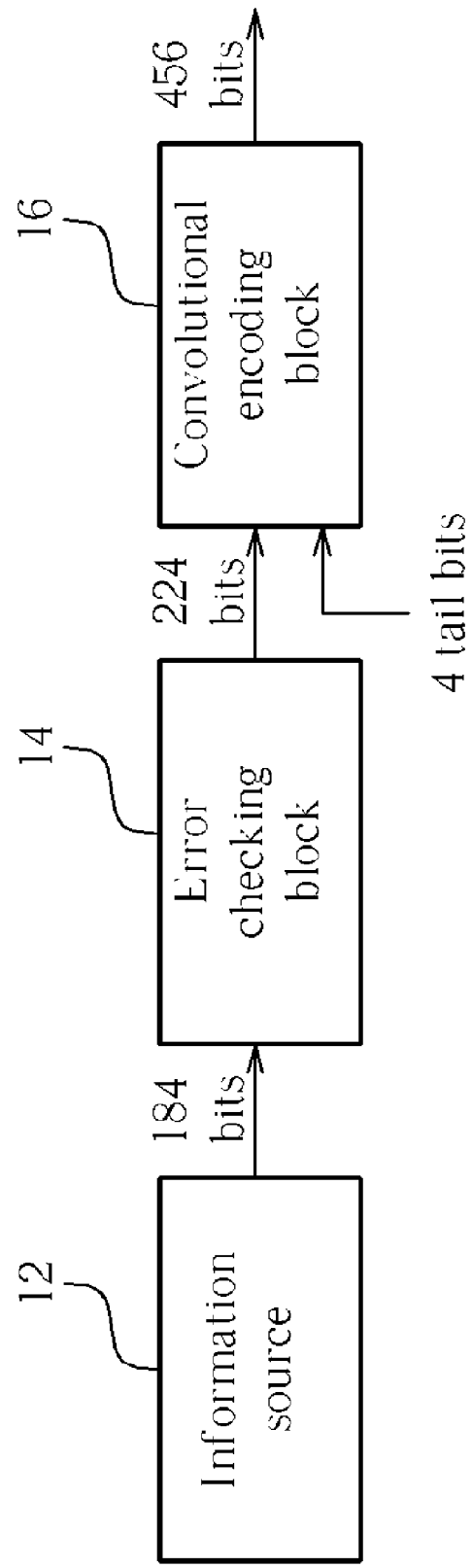
FIG. 1 is a diagram illustrating an encoding architecture for the FACCH frame.
Figure 2:
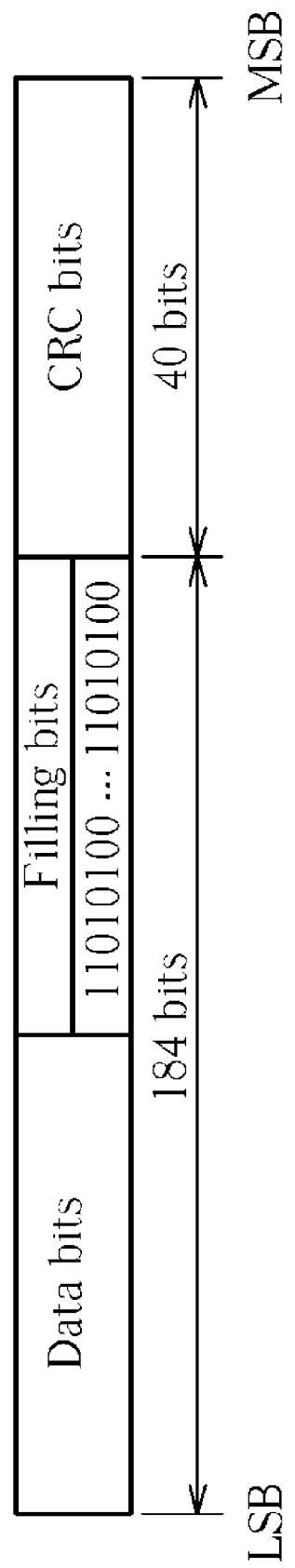
FIG. 2 is a diagram illustrating a resultant data frame including the filling bits appended to the raw data bits.

The boundary detecting module 306 is configured to detect a boundary of encoded bits corresponding to the filling bits appended to the raw data bits. Taking the encoded FACCH frame for example, the boundary detecting module 306 is used to estimate a start position of encoded bits (i.e., dummy bit sequences included in the encoded data frame) corresponding to the added filling bits only because an end position is known according to the frame format shown in FIG. 2. In other words, as the CRC bits are defined to have a bit length equal to 40 and the channel coding algorithm is also known to have a code rate equal to 1/2, the end position of the encoded bits corresponding to the added filling bits can be quickly determined. The boundary information BI is outputted from the boundary detecting module 306 to the decoding module 304 and the control module 308 for subsequent decoding process.

In one embodiment of the present invention, after notified by the boundary information BI, the decoding module 304 is capable of decoding encoded bits preceding the estimated start position of the dummy bit sequences corresponding to the filling bits and decoding encoded bits following the end position of dummy bit sequences corresponding to the filling bits to thereby generate a partial decoding result. Next, the control module 308 generates a decoded data frame $D_{out}$ by the partial decoding result given from the decoding module 304 and a plurality of predetermined bit patterns (e.g., the aforementioned bit pattern "0x2B" applied to the FACCH frame) each corresponding to one of the dummy bit sequences within the boundary between the start and end positions. In another embodiment, after notified by the boundary information BI, the control module 308 generates a decoded data frame $D_{out}$ by updating an initial decoded data frame generated from the decoding module 304 according to a plurality of predetermined bit patterns each corresponding to one of the dummy bit sequences within the boundary between the start and end positions. Further description directed to these embodiments is detailed as below.

Figure 4:
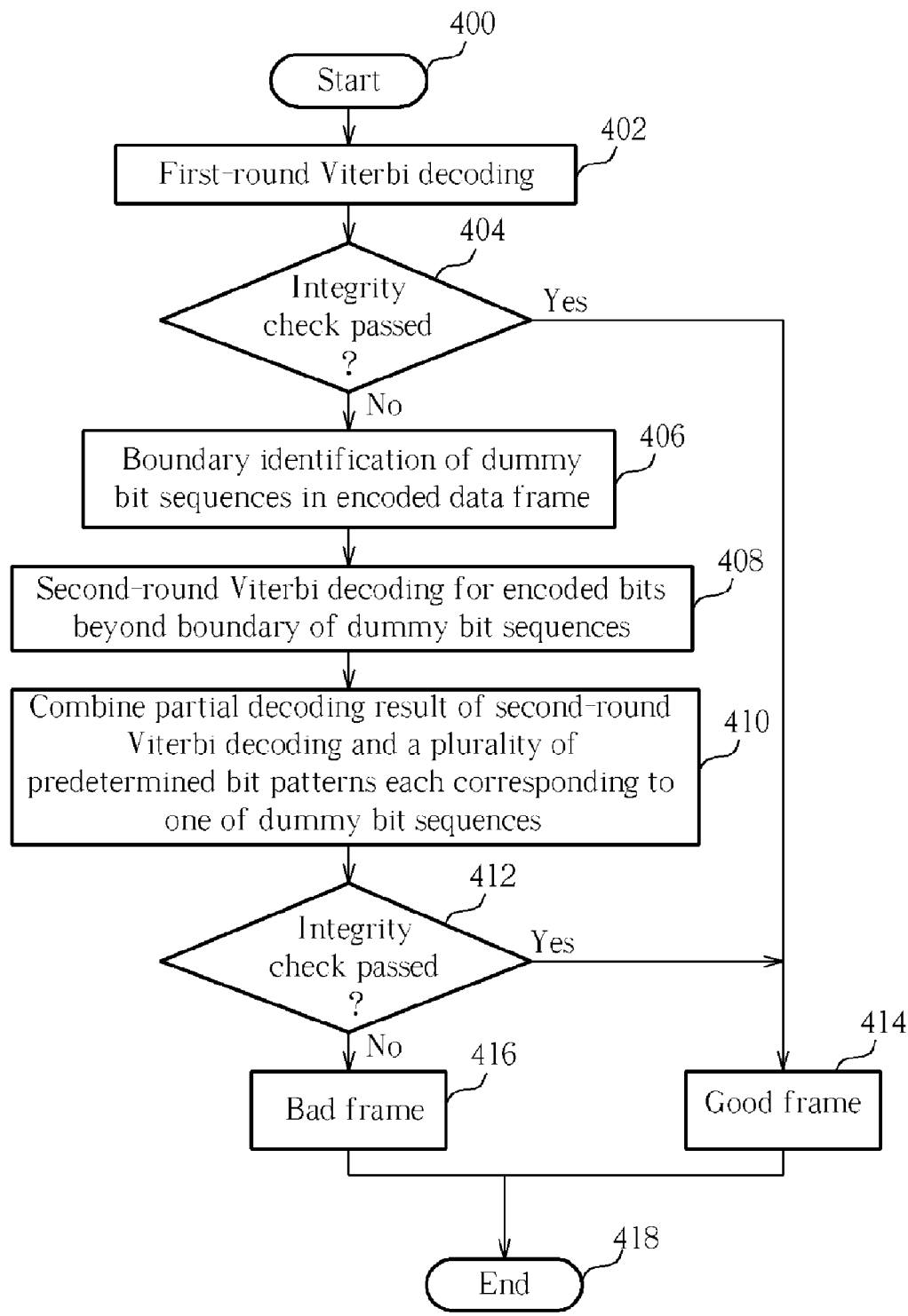
FIG. 4 is a flowchart illustrating a first decoding method employed by the decoder shown in FIG. 3.

Please refer to FIG. 3 in conjunction with FIG. 4. FIG. 4 is a flowchart illustrating a first decoding method employed by the decoder 300 shown in FIG. 3. In an exemplary embodiment of the present invention, the first decoding method includes following steps. In step 400, the flow begins. In step 402, the decoding module 304 performs a first-round Viterbi decoding upon the encoded data frame $D_{in}$ (e.g., the encoded FACCH frame) according to soft or hard decision outputs of the equalizing module 302, and then generates a decoding result of the encoded data frame $D_{in}$. In other words, through the Viterbi decoding applied to one FACCH frame of 456 encoded bits, an initial decoded data frame of 228 bits is obtained where the final 40 bits are deemed as error checking information (i.e., CRC bits) according to the frame format shown in FIG. 2. In step 404, an integrity check is applied to the initial decoded data frame according to the CRC bits. If the initial decoded data frame passes the integrity check, meaning that there is error free within the initial decoded data frame, the flow proceeds to step 414 to output the initial decoded data frame as a decoding result of the encoded data frame $D_{in}$. That is, the decoded data frame $D_{out}$ is the initial decoded data frame directly as the Viterbi decoding is able to output a good FACCH frame. However, if the initial decoded data frame fails to pass the integrity check, meaning that the initial decoded data frame still includes errors, the flow proceeds to step 406.

Step 406 is used to locate a boundary of dummy bit sequences in the encoded data frame $D_{in}$. As mentioned above, the end position of dummy bit sequences corresponding to the filling bits can be easily known according to the predetermined frame format shown in FIG. 2 and the predetermined channel coding algorithm with a code rate equal to 1/2. Therefore, in this embodiment, step 406 merely focuses on estimating the start position of dummy bit sequences corresponding to the filling bits appended to raw data bits. The operation of determining the boundary of dummy bit sequences in the encoded data frame $D_{in}$ is detailed as below.

Figure 5:
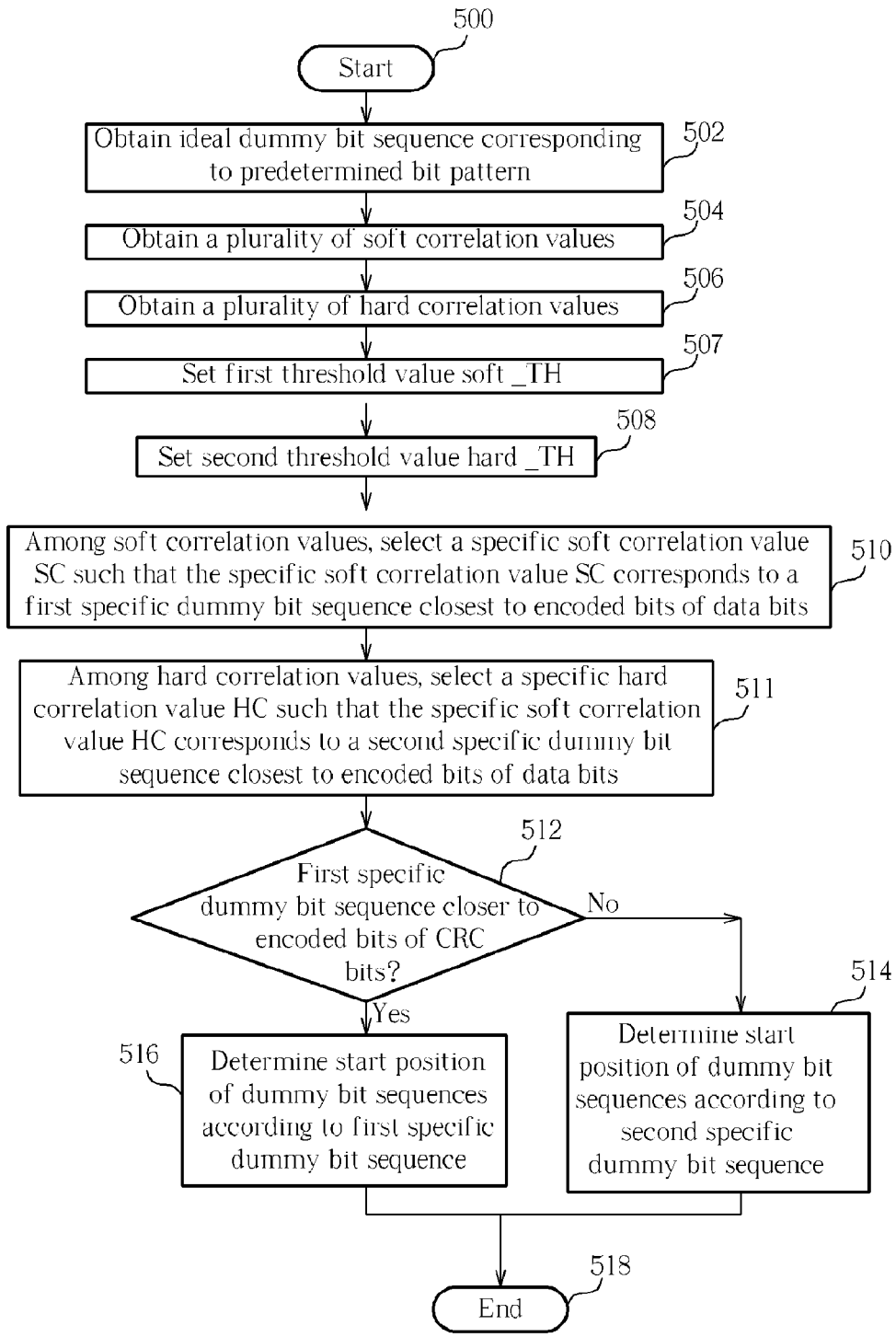
FIG. 5 is a flowchart illustrating a first embodiment of step 406 for estimating the start position of dummy bit sequences corresponding to the filling bits appended to the raw data bits.

Please refer to FIG. 5. FIG. 5 is a flowchart illustrating a first embodiment of step 406 for estimating the start position of dummy bit sequences corresponding to the filling bits appended to the raw data bits. In step 500, the flow starts. In step 502, an ideal dummy bit sequence corresponding to the predetermined bit pattern (e.g., 0x2B from LSB to MSB) is obtained. For example, as the channel coding algorithm for the FACCH frame is already known, the predetermined bit pattern can be encoded using the same channel coding algorithm with the initial state set by 0x2, i.e., (0,1,0,0) from LSB to MSB. As a result, 16 encoded bits is obtained to act as the ideal dummy bit sequence used in the following steps. In step 504, a plurality of soft correlation values are obtained according to soft decision values of the encoded data frame $D_{in}$ and the ideal dummy data frame obtained in step 502. A soft correlation value may be acquired by multiplying a soft decision value of the encoded data frame $D_{in}$ by a corresponding bit of the ideal dummy data frame obtained in step 502. Similarly, in step 506, a plurality of hard correlation values are obtained according to hard decision values of the counterpart soft decision values and the aforementioned ideal dummy bit sequence, where each hard decision value is calculated by turning a corresponding soft decision value to either "1" or "0", or either "1" or "−1" according to the polarity thereof. A hard correlation value may be acquired by multiplying a hard decision value of the encoded data frame $D_{in}$ by a corresponding bit of the ideal dummy data frame obtained in step 502. In this embodiment, if there is no filling bit appended to the data bits, the maximum byte length of the data bits is equal to 23 as the total number of data bits is 184; however, if there are filling bits appended to the data bits, the minimum byte length of the data bits is 2 or 3 due to existence of header bytes with provide auxiliary information such as a length indicator. Therefore, the number of dummy bit sequences presented in the encoded data frame $D_{in}$ falls in a range from 0 to 21. In a preferred embodiment, based upon the known end position of the dummy sequences, the ideal dummy sequence is correlated with 21 encoded bytes of the encoded data frame $D_{in}$ according to a soft correlation scheme and a hard correlation scheme, individually, to get 21 soft correlation values and 21 hard correlation values. However, this is not meant to be a limitation of the present invention. For example, in another embodiment without departing from the spirit of the present invention, the ideal dummy sequence is allowed to be correlated with 23 encoded bytes of the encoded data frame $D_{in}$ preceding the known end position of the dummy sequences to get 23 soft correlation values and 23 hard correlation values.

In steps 507 and 508, a first threshold value soft_TH and a second threshold value hard_TH are set. As the soft decision values is dependent upon the communication channel, the first threshold value soft_TH in this embodiment is dynamically set by a value equal to the maximum value Max_soft found among the calculated soft correlation values multiplied by a scaling factor R, for example, 0.8. That is, soft_TH=Max_soft*R. Regarding the second threshold value soft_TH, as each hard decision value is either "1" or "0", or either "1" or "−1", the second threshold value soft_TH therefore can be set by a predetermined value directly. Because the ideal dummy bit sequence generated from encoding the predetermined bit pattern has 16 bits, the possible maximum hard correlation value is known to be 16. In this embodiment, the second threshold value hard_TH is set by any value greater than 10, depending upon design requirements. It should be noted that above settings of the first threshold value soft_TH and the second threshold value hard_TH are for illustrative purposes only, and not meant to be limitations of the present invention.

In step 510, a specific soft correlation value SC is selected from the calculated soft correlation values. In this embodiment, the specific soft correlation value SC is identified among a plurality of successive soft correlation values not less than the first threshold value soft_TH and including a soft correlation value corresponding to a dummy bit sequence immediately prior to encoded bits corresponding to the raw (un-coded) CRC bits. After the specific soft correlation value SC is found, a first specific dummy bit sequence, which is closest to the encoded bits of raw data bits among the dummy bit sequences corresponding to the successive soft correlation values, is identified accordingly.

Similarly, in step 511, a specific hard correlation value HC is selected from the calculated hard correlation values. In this embodiment, the specific hard correlation value HC is identified among a plurality of successive hard correlation values not less than the second threshold value hard_TH and including a hard correlation value corresponding to a dummy bit sequence immediately prior to encoded bits corresponding to the raw (un-coded) CRC bits. After the specific hard correlation value HC is found, a second specific dummy bit sequence, which is closest to the encoded bits of raw data bits among the dummy bit sequences corresponding to the successive hard correlation values, is identified as well.

In step 512, the position of the specific soft correlation value SC identified in step 510 is compared with the position of the specific hard correlation value HC identified in step 511. When the first specific dummy bit sequence is closer to the encoded bits corresponding to the raw CRC bits than the second specific dummy bit sequence, the flow proceeds to step 516 to determine that the estimated start position of the dummy bit sequences is the leading bit of the first specific dummy bit sequence. In other words, the boundary is determined to start from the leading bit of the first specific dummy bit sequence and end at the ending bit of the dummy bit sequence immediately prior to the encoded bits corresponding to the raw CRC bits. Otherwise, the flow goes to step 514 to determine that the estimated start position of the dummy bit sequences is the leading bit of the second specific dummy bit sequence. That is, the boundary of dummy bit sequences is determined to start from the leading bit of the second specific dummy bit sequence and end at the ending bit of the dummy bit sequence immediately prior to the encoded bits corresponding to raw CRC bits. In step 518, the boundary identification procedure is completed.

Figure 6:
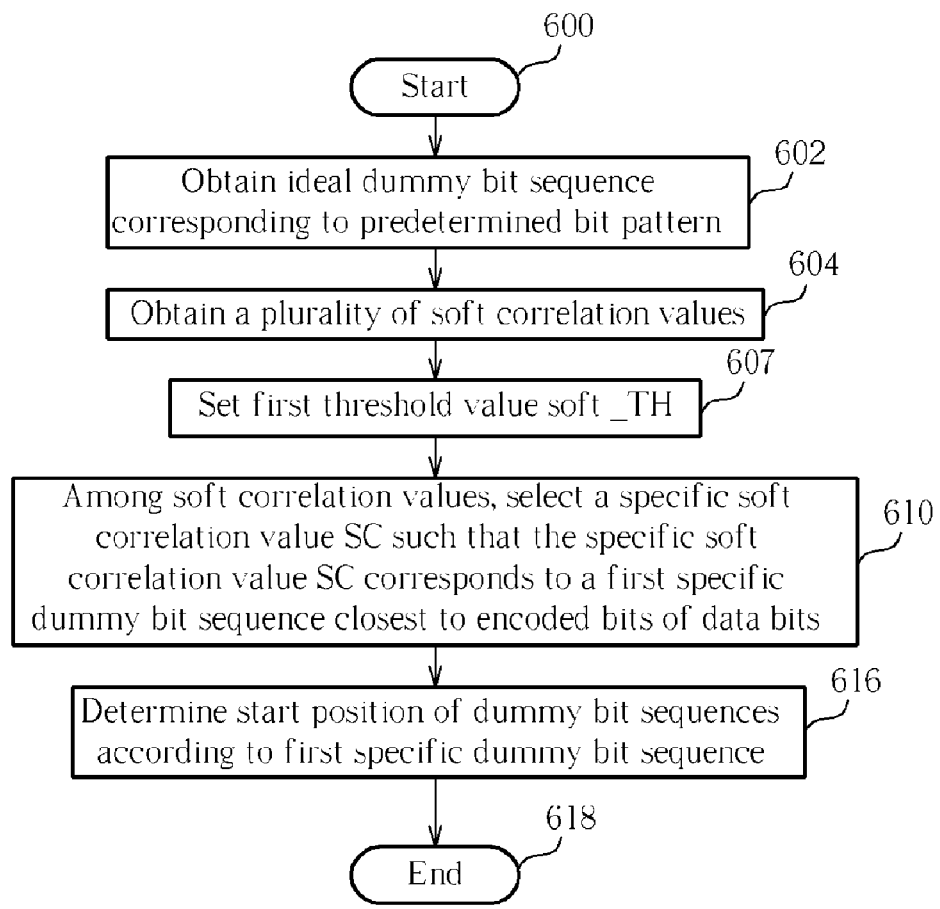
FIG. 6 is a flowchart illustrating a second embodiment of step 406 for estimating the start position of dummy bit sequences in the encoded data frame.
Figure 7:
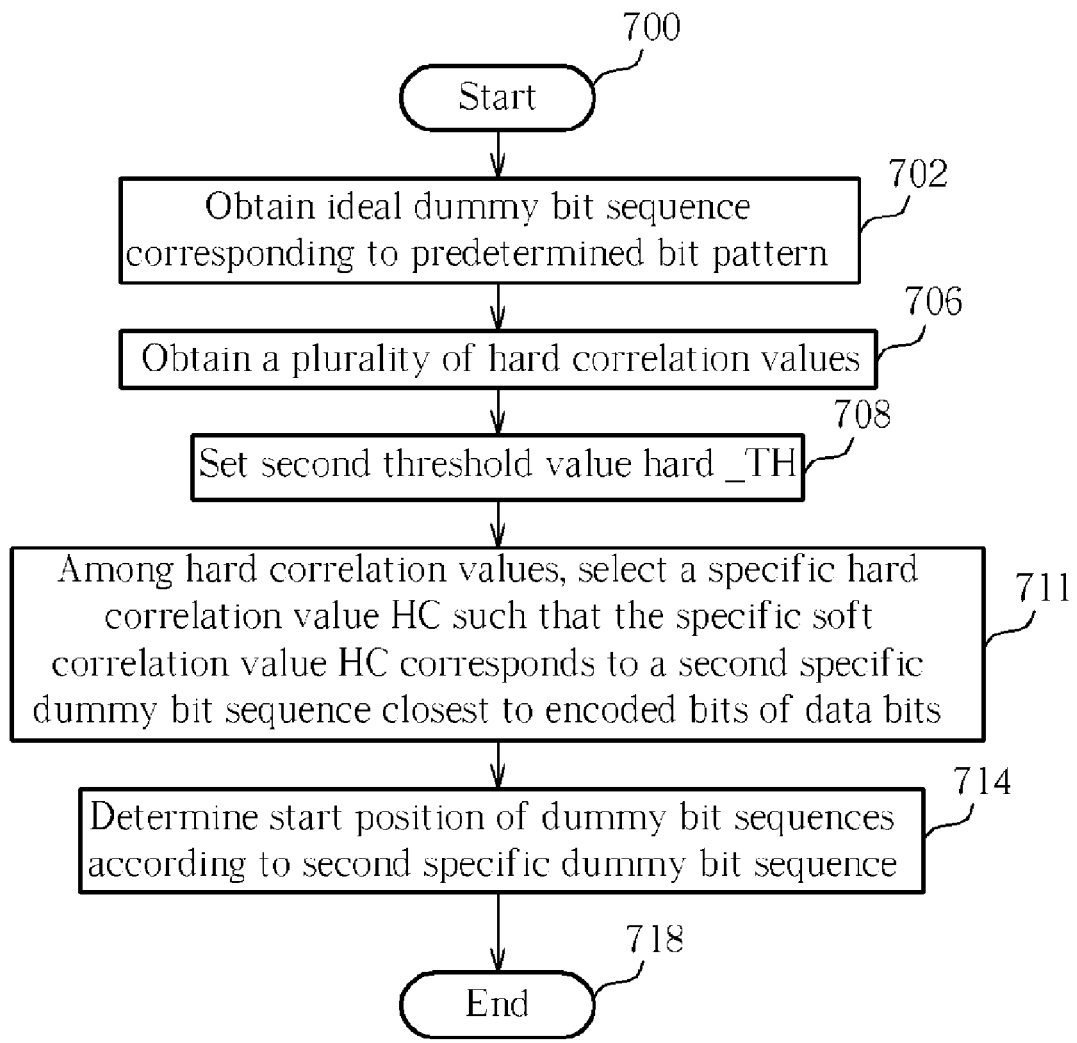
FIG. 7 is a flowchart illustrating a third embodiment of step 406 for estimating the start position of dummy bit sequences in the encoded data frame.

In above exemplary embodiment, the soft correlation values and hard correlation values are both utilized to estimate the start position of the dummy bit sequences in the encoded data frame $D_{in}$; however, this is not meant to be a limitation of the present invention, and other alternative designs are possible. Please refer to FIG. 6 and FIG. 7. FIG. 6 is a flowchart illustrating a second embodiment of step 406 for estimating the start position of dummy bit sequences in the encoded data frame. FIG. 7 is a flowchart illustrating a third embodiment of step 406 for estimating the start position of dummy bit sequences in the encoded data frame. With appropriate modifications made to the flow shown in FIG. 5, an alternative design of estimating the start position of dummy bit sequences through soft correlation values is obtained; similarly, another alternative design of estimating the start position of dummy bit sequences through hard correlation values is obtained. As the operations of steps 600-618 shown in FIG. 6 and steps 700-718 shown in FIG. 7 are detailed above, further description is omitted here for the sake of brevity.

The above is directed to identifying the start position of the dummy bit sequences included in the encoded FACCH frame. The steps 510, 511, 610, and 711 adopt a protection mechanism to avoid selecting an erroneous start position which is located at a bit position of any encoded bit corresponding to a raw (un-coded) data bit. It should be noted that this boundary identification mechanism is for illustrative purposes only, and is not meant to be a limitation of the present invention. In short, any boundary identification mechanism using the soft correlation values, the hard correlation values or a combination thereof to estimate a start position and an end position of dummy bit sequences in the encoded data frame falls in the scope of the present invention.

Moreover, provided that the encoded data frame $D_{in}$ (e.g., the encoded FACCH frame) carries a length indicator in one header byte for indicating a data length of raw data bits, the length indicator LI is accessed from the initial decoded data frame generated in step 402 and passed to the boundary detecting module 306. Referring to information given by the length indicator LI read from the initial decoded data frame generated by the decoding module 304, the start position of the dummy bit sequences corresponding to the filling bits appended to the data bits can be estimated accordingly.

Please refer to FIG. 4 again. After the boundary of dummy bit sequences (e.g., the start position and the end position) are known, the flow proceeds to step 408 to enable a second-round Viterbi decoding. In this embodiment, the second-round Viterbi decoding includes decoding encoded bits preceding the start position of the dummy bit sequences and decoding encoded bits following the end position of the dummy bit sequences individually. Referring to the FACCH frame shown in FIG. 2, each filling byte inserted between the data bytes and the CRC bytes has the predetermined bit pattern of 0x2B from LSB to MSB. Therefore, during the second-round Viterbi decoding, the decoding module 304 uses (1,1,0,1) as the end state directly when decoding encoded bits preceding the start position of the dummy bit sequences, and uses (0,1,0,0) as the start state directly when decoding encoded bits following the end position of the dummy bit sequences. As the Viterbi decoding algorithm is well known to those skilled in this art, further description pertinent to the above second-round Viterbi decoding is omitted here for brevity.

Next, a partial decoding result is outputted to the control module 308 by the decoding module 304. In step 410, the control module 308 reconstructs the raw FACCH frame by combining the partial decoding result, including decoded bits corresponding to the data bits and the CRC bits, and a plurality of predetermined bit patterns each corresponding to one of the dummy bit sequences within the boundary from the start position to the end position.

In step 412, an integrity check is applied to the decoded data frame generated in step 410 according to the error checking information (i.e., CRC bits) included therein. If the decoded data frame (i.e., the reconstructed FACCH frame) passes the integrity check, meaning that there is no error bit within the decoded data frame, the flow proceeds to step 414 to output the decoded data frame as a decoding result of the encoded data frame $D_{in}$. That is, the outputted decoded data frame $D_{out}$ is the reconstructed FACCH frame generated in step 410 because the reconstructed FACCH frame is regarded as a good FACCH frame. However, if the decoded data frame fails to pass the integrity check, meaning that the decoded data frame still includes error bits, the flow proceeds to step 416 to indicate a decoding failure as the reconstructed FACCH frame generated in step 410 is a bad FACCH frame. In step 418, the decoding procedure for the current encoded data frame $D_{in}$ is completed.

In the above embodiment, the second-round Viterbi decoding is enabled after the first-round Viterbi decoding fails to generate error-free decoding result. However, the first-round Viterbi decoding could be optional in other embodiments of the present invention, depending upon design requirements. For example, when decoding the incoming encoded data frame $D_{in}$, the decoder 300 determines the boundary of dummy bit sequences first and then applies the aforementioned second-round Viterbi decoding according to steps 406-414. No first-round Viterbi decoding is required in this case. Because the encoded data frame is divided into encoded bits to be decoded by the Viterbi decoding and dummy bit sequences requiring no Viterbi decoding according to the identified boundary of the dummy bit sequences, the decoding module 304 only has to decode encoded bits beyond the boundary of the dummy bit sequences rather than the whole encoded data frame $D_{in}$. In this way, as the amount of encoded bits to be decoded is reduced, the performance of the Viterbi decoding is improved accordingly. It should be noted that in a case where the length indicator is used as a reference to determine the boundary of the dummy bit sequences included in the encoded data byte, the first-round Viterbi decoding is required to produce the initial decoded data frame for offering the desired length indicator information carried by the header byte of the raw FACCH frame.

Figure 8:
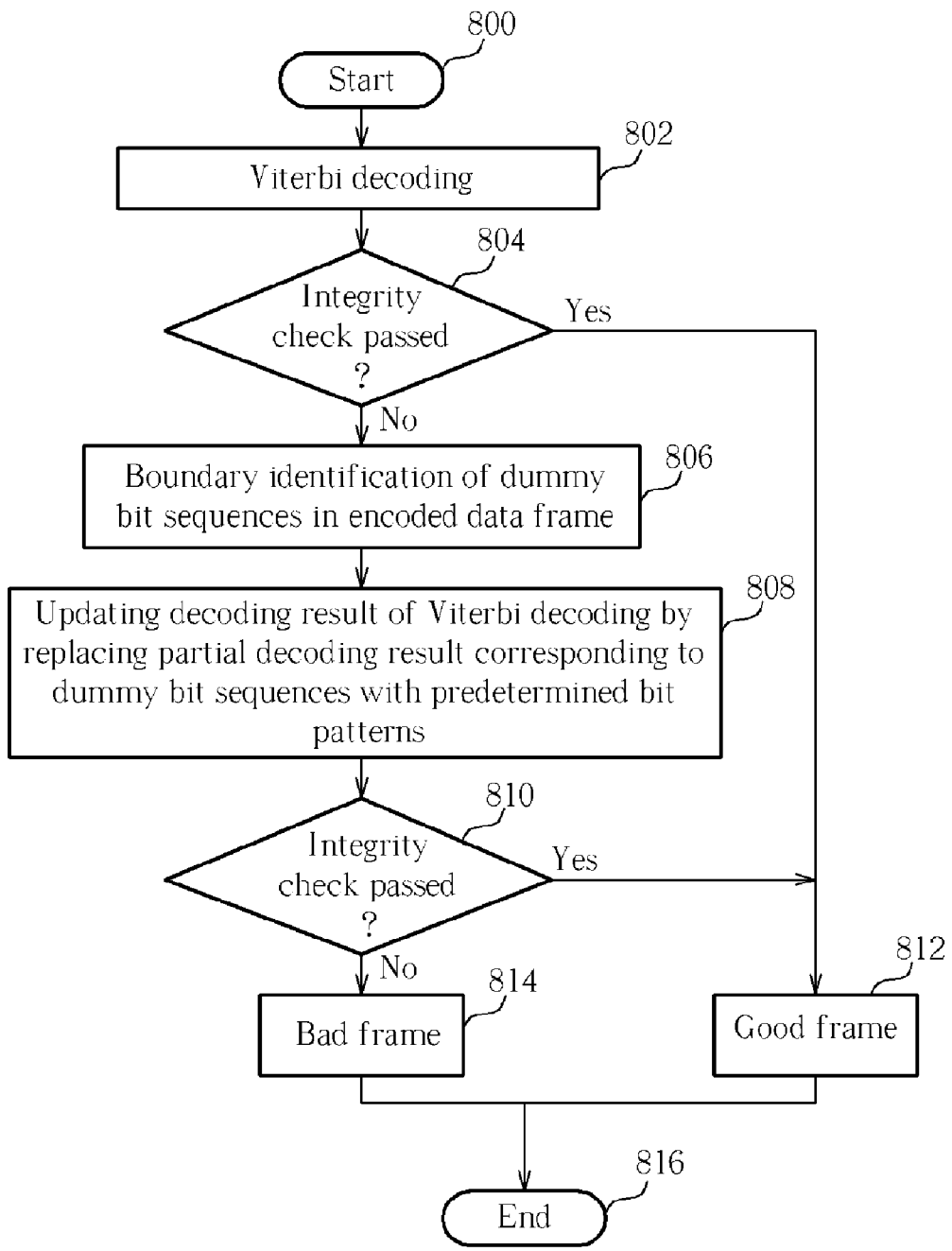
FIG. 8 is a flowchart illustrating a second decoding method implemented by the decoder shown in FIG. 3.

Additionally, the flow in above embodiment enables the second-round Viterbi decoding upon the encoded bits beyond boundary of the dummy bit sequences in the encoded data frame to improve the decoding performance with the help of known start state and end state given by the predetermined bit pattern (e.g., 0x2B from LSB to MSB). However, as the predetermined bit pattern is known, directly replacing each dummy bit sequence presented in the encoded data frame by the predetermined bit pattern is sure to guarantee that the decoding result of the dummy bit sequences is correct. This also improves the successful acquisition probability of encoded data frames. In this alternative design, the decoding module 304 is not configured to perform the second-round Viterbi decoding, and the control module 308 generates the decoded data frame $D_{out}$ by updating the decoding result of the first-round Viterbi decoding according to a plurality of predetermined bit patterns each corresponding to one of the dummy bit sequences within the identified boundary. Please refer to FIG. 8. FIG. 8 is a flowchart illustrating a second decoding method implemented by the decoder 300 shown in FIG. 3. The steps shown in FIG. 8 are similar to that shown in FIG. 4. In view of above disclosure, the operations of steps 800-806 and 810-816 are self-explanatory, and further description is omitted for brevity. Regarding step 808, the partial decoding result corresponding to the dummy bit sequences within the boundary from the start position to the end position are replaced with predetermined bit patterns to directly remove any error bits presented in this data section.

Please note that the decoding scheme of the present invention is not limited to be applied to FACCH frames only. For example, the above exemplary decoding scheme can be applied to paging channel (PCH) frames or packet data traffic channel (PDTCH) frames. In short, for communication systems such as 2G or 3G systems, the decoding scheme of the present invention can be applied to any layer-2 frame having filling bits appended to the data bits.

Those skilled in the art will readily observe that numerous modifications and alterations of the device and method may be made while retaining the teachings of the invention.

What is claimed is:

1. A decoder for decoding an encoded data frame including dummy bit sequences each generated from encoding a predetermined bit pattern, the decoder comprising:
   a boundary detecting module, configured to determine a boundary of the dummy bit sequences in the encoded data frame;
   a decoding module, coupled to the boundary detecting module, the decoding module configured to decode encoded bits beyond the boundary according to the predetermined bit pattern and accordingly generate a partial decoding result, wherein the encoded bits beyond the boundary is decoded according to a Viterbi decoding, the dummy bit sequences within the boundary are sandwiched by a first portion of the encoded bits beyond the boundary and a second portion of the encoded bits beyond the boundary, and the decoding module decodes the encoded bits beyond the boundary by:
      decoding the first portion of the encoded bits according to a first part of the predetermined bit pattern serving as a first reference state of the Viterbi decoding; and
      decoding the second portion of the encoded bits according to a second part of the predetermined bit pattern serving as a second reference state of the Viterbi decoding; and
   a control module, coupled to the boundary detecting module and the decoding module, the control module configured to generate a decoded data frame according to the partial decoding result and a plurality of predetermined bit patterns each corresponding to one of the dummy bit sequences within the boundary.

2. The decoder of claim 1, wherein the decoded data frame includes error checking information, and an integrity check is performed upon the decoded data frame according to the error checking information; when the decoded data frame passes the integrity check, the control module outputs the decoded data frame as a decoding result of the encoded data frame; and when the decoded data frame fails to pass the integrity check, the control module indicates a decoding failure.

3. The decoder of claim 1, wherein the decoding module further decodes the encoded data frame to generate an initial decoded data frame including error checking information; an integrity check is performed upon the initial decoded data frame according to the error checking information; when the initial decoded data frame passes the integrity check, the control module outputs the initial decoded data frame as a decoding result of the encoded data frame; and when the initial decoded data frame fails to pass the integrity check, the boundary detecting module estimates the boundary of dummy bit sequences and the decoding module generates the decoded data frame.

4. The decoder of claim 3, wherein the encoded data frame is decoded according to the Viterbi decoding.

5. The decoder of claim 3, wherein the dummy bit sequences are defined to be appended to the first portion of encoded bits and followed by the second portion of the encoded bits, and the boundary detecting module determines the boundary of dummy bit sequences by:
   reading a length indicator from the initial decoded data frame, wherein the length indicator indicates a data length of original bits corresponding to the first portion of encoded bits; and
   referring to the length indicator, determining the boundary to start from a leading bit of a specific dummy bit sequence immediately following the first portion of encoded bits and end at an ending bit of another specific dummy bit sequence immediately prior to the second portion of encoded bits.

6. The decoder of claim 1, wherein the boundary detecting module determines the boundary of dummy bit sequences by:
   determining an ideal dummy bit sequence corresponding to the predetermined bit pattern;
   obtaining a soft decision value of each bit in the encoded data frame;
   obtaining a plurality of soft correlation values according to the ideal dummy bit sequence and a plurality of soft decision values of the encoded data frame; and
   monitoring the soft correlation values to determine the boundary.

7. The decoder of claim 6, wherein the dummy bit sequences are defined to be appended to the first portion of encoded bits and followed by the second portion of the encoded bits, and the boundary detecting module monitors the soft correlation values to determine the boundary by:
   among a plurality of successive soft correlation values not less than a threshold value and including a soft correlation value corresponding to a dummy bit sequence immediately prior to the second portion of encoded bits, identifying a specific soft correlation value corresponding to a specific dummy bit sequence closest to the first portion of encoded bits; and
   determining the boundary to start from a leading bit of the specific dummy bit sequence and end at an ending bit of another specific dummy bit sequence immediately prior to the second portion of encoded bits.

8. The decoder of claim 1, wherein the boundary detecting module determines the boundary of dummy bit sequences by:
   determining an ideal dummy bit sequence corresponding to the predetermined bit pattern;
   obtaining a hard decision value according to a soft decision value of each bit in the encoded data frame;
   obtaining a plurality of hard correlation values according to the ideal dummy bit sequence and a plurality of hard decision values of the encoded data frame; and
   monitoring the hard correlation values to determine the boundary.

9. The decoder of claim 8, wherein the dummy bit sequences are defined to be appended to the first portion of encoded bits and followed by the second portion of the encoded bits, and the boundary detecting module monitors the hard correlation values to determine the boundary by:
   among a plurality of successive hard correlation values not less than a threshold value and including a hard correlation value corresponding to a dummy bit sequence immediately prior to the second portion of encoded bits, identifying a specific hard correlation value corresponding to a specific dummy bit sequence closest to the first portion of encoded bits; and
   determining the boundary to start from a leading bit of the specific dummy bit sequence and end at an ending bit of another specific dummy bit sequence immediately prior to the second portion of encoded bits.

10. The decoder of claim 1, wherein the boundary detecting module determines the boundary of dummy bit sequences by:
  determining an ideal dummy bit sequence corresponding to the predetermined bit pattern;
  obtaining a soft decision value of each bit in the encoded data frame;
  obtaining hard decision values according to a plurality of soft decision values of the encoded data frame;
  obtaining a plurality of soft correlation values according to the ideal dummy bit sequence and the soft decision values of the encoded data frame;
  obtaining a plurality of hard correlation values according to the ideal dummy bit sequence and the hard decision values of the encoded data frame; and
  monitoring the soft correlation values and the hard correlation values to determine the boundary.

11. The decoder of claim 10, wherein the dummy bit sequences are defined to be appended to the first portion of encoded bits and followed by the second portion of the encoded bits, and the boundary detecting module monitors the soft correlation values and the hard correlation value to determine the boundary by:
  among a plurality of successive soft correlation values not less than a first threshold value and including a soft correlation value corresponding to a dummy bit sequence immediately prior to the second portion of encoded bits, identifying a specific soft correlation value corresponding to a first specific dummy bit sequence closest to the first portion of encoded bits;
  among a plurality of successive hard correlation values not less than a second threshold value and including a hard correlation value corresponding to a dummy bit sequence immediately prior to the second portion of encoded bits, identifying a specific hard correlation value corresponding to a second specific dummy bit sequence closest to the first portion of encoded bits;
  when the first specific dummy bit sequence is closer to the second portion of encoded bits than the second specific dummy bit sequence, determining the boundary to start from a leading bit of the first specific dummy bit sequence and end at an ending bit of another specific dummy bit sequence immediately prior to the second portion of encoded bits; and
  when the second specific dummy bit sequence is closer to the second portion of encoded bits than the first specific dummy bit sequence, determining the boundary to start from a leading bit of the second specific dummy bit sequence and end at an ending bit of another specific dummy bit sequence immediately prior to the second portion of encoded bits.

12. The decoder of claim 1, wherein the encoded data frame is received via a wireless communication channel.

13. A decoder for decoding an encoded data frame including dummy bit sequences each generated from encoding a predetermined bit pattern, the decoder comprising:
  a decoding module, configured to generate an initial decoded data frame by decoding the encoded data frame;
  a boundary detecting module, configured to determine a boundary of dummy bit sequences in the encoded data frame, wherein the dummy bit sequences are defined to be appended to a first portion of encoded bits and followed by a second portion of the encoded bits, and the boundary detecting module determines the boundary of dummy bit sequences by:
    reading a length indicator from the initial decoded data frame, wherein the length indicator indicates a data length of original bits corresponding to the first portion of encoded bits; and
    referring to the length indicator, determining the boundary to start from a leading bit of a specific dummy bit sequence immediately following the first portion of encoded bits and end at an ending bit of another specific dummy bit sequence immediately prior to the second portion of encoded bits; and
  a control module, coupled to the decoding module and the boundary detecting module, the control module configured to generate an updated decoded data frame by replacing each decoded bit sequence in the initial decoded data frame that corresponds to one dummy bit sequence within the boundary with the predetermined bit pattern.

14. The decoder of claim 13, wherein the initial decoded data frame includes error checking information, and an integrity check is performed upon the initial decoded data frame according to the error checking information; when the initial decoded data frame passes the integrity check, the control module outputs the initial decoded data frame as a decoding result of the encoded data frame; and when the initial decoded data frame fails to pass the integrity check, the boundary detecting module determines the boundary of dummy bit sequences and the decoding module generates the updated decoded data frame.

15. A decoder for decoding an encoded data frame including dummy bit sequences each generated from encoding a predetermined bit pattern, the decoder comprising:
  a decoding module, configured to generate an initial decoded data frame by decoding the encoded data frame;
  a boundary detecting module, configured to generate a boundary of dummy bit sequences in the encoded data frame by:
    determining an ideal dummy bit sequence corresponding to the predetermined bit pattern;
    obtaining a soft decision value of each bit in the encoded data frame;
    obtaining a plurality of soft correlation values according to the ideal dummy bit sequence and a plurality of soft decision values of the encoded data frame; and
    monitoring the soft correlation values to determine the boundary; and
  a control module, coupled to the decoding module and the boundary detecting module, the control module configured to generate an updated decoded data frame by replacing each decoded bit sequence in the initial decoded data frame that corresponds to one dummy bit sequence within the boundary with the predetermined bit pattern.

16. The decoder of claim 15, wherein the dummy bit sequences are defined to be appended to a first portion of encoded bits and followed by a second portion of the encoded bits, and the boundary detecting module monitors the soft correlation values to determine the boundary by:
  identifying a specific soft correlation value not less than a threshold value and corresponding to a specific dummy bit sequence closest to the second portion of encoded bits; and
  determining the boundary to start from a leading bit of the specific dummy bit sequence and end at an ending bit of another specific dummy bit sequence immediately prior to the second portion of encoded bits.

17. A decoder for decoding an encoded data frame including dummy bit sequences each generated from encoding a predetermined bit pattern, the decoder comprising:
- a decoding module, configured to generate an initial decoded data frame by decoding the encoded data frame;
- a boundary detecting module, configured to determine a boundary of dummy bit sequences in the encoded data frame by:
  - determining an ideal dummy bit sequence corresponding to the predetermined bit pattern;
  - obtaining a hard decision value according to a soft decision value of each bit in the encoded data frame;
  - obtaining a plurality of hard correlation values according to the ideal dummy bit sequence and a plurality of hard decision values of the encoded data frame; and
  - monitoring the hard correlation values to determine the boundary; and
- a control module, coupled to the decoding module and the boundary detecting module, the control module configured to generate an updated decoded data frame by replacing each decoded bit sequence in the initial decoded data frame that corresponds to one dummy bit sequence within the boundary with the predetermined bit pattern.

18. The decoder of claim 17, wherein the dummy bit sequences are defined to be appended to a first portion of encoded bits and followed by a second portion of the encoded bits, and the boundary detecting module monitors the hard correlation values to determine the boundary by:
- identifying a specific hard correlation value not less than a threshold value and corresponding to a specific dummy bit sequence closest to the second portion of encoded bits; and
- determining the boundary to start from a leading bit of the specific dummy bit sequence and end at an ending bit of another specific dummy bit sequence immediately prior to the second portion of encoded bits.

19. A decoder for decoding an encoded data frame including dummy bit sequences each generated from encoding a predetermined bit pattern, the decoder comprising:
- a decoding module, configured to generate an initial decoded data frame by decoding the encoded data frame;
- a boundary detecting module, configured to determine a boundary of dummy bit sequences in the encoded data frame by:
  - determining an ideal dummy bit sequence corresponding to the predetermined bit pattern;
  - obtaining a soft decision value of each bit in the encoded data frame;
  - obtaining hard decision values according to a plurality of soft decision values of the encoded data frame;
  - obtaining a plurality of soft correlation values according to the ideal dummy bit sequence and the soft decision values of the encoded data frame;
  - obtaining a plurality of hard correlation values according to the ideal dummy bit sequence and the hard decision values of the encoded data frame; and
  - monitoring the soft correlation values and the hard correlation values to determine the boundary; and
- a control module, coupled to the decoding module and the boundary detecting module, the control module configured to generate an updated decoded data frame by replacing each decoded bit sequence in the initial decoded data frame that corresponds to one dummy bit sequence within the boundary with the predetermined bit pattern.

20. The decoder of claim 19, wherein the dummy bit sequences are defined to be appended to a first portion of encoded bits and followed by a second portion of the encoded bits, and the boundary detecting module monitors the soft correlation values and the hard correlation value to determine the boundary by:
- identifying a specific soft correlation value not less than a first threshold value and corresponding to a first specific dummy bit sequence closest to the second portion of encoded bits;
- identifying a specific hard correlation value not less than a second threshold value and corresponding to a second specific dummy bit sequence closest to the second portion of encoded bits;
- when the first specific dummy bit sequence is closer to the second portion of encoded bits than the second specific dummy bit sequence, determining the boundary to start from a leading bit of the first specific dummy bit sequence and end at an ending bit of another specific dummy bit sequence immediately prior to the second portion of encoded bits; and
- when the second specific dummy bit sequence is closer to the second portion of encoded bits than the first specific dummy bit sequence, determining the boundary to start from a leading bit of the second specific dummy bit sequence and end at an ending bit of another specific dummy bit sequence immediately prior to the second portion of encoded bits.

21. A decoder for decoding an encoded data frame including dummy bit sequences each generated from encoding a predetermined bit pattern, the decoder comprising:
- a boundary detecting module, configured to determine a boundary of dummy bit sequences in the encoded data frame when an initial decoded data frame fails to pass an integrity check performed upon the initial decoded data frame according to error checking information;
- a decoding module, coupled to the boundary detecting module, the decoding module configured to decode the encoded data frame to generate the initial decoded data frame including the error checking information, wherein when the initial decoded data frame fails to pass the integrity check, the decoding module is further configured to decode encoded bits beyond the boundary according to the predetermined bit pattern to generate a partial decoding result; and
- a control module, coupled to the boundary detecting module and the decoding module, the control module configured to output the initial decoded data frame as a decoding result of the encoded data frame when the initial decoded data frame passes the integrity check, and generate a decoded data frame according to the partial decoding result and a plurality of predetermined bit patterns each corresponding to one of the dummy bit sequences within the boundary when the initial decoded data frame fails to pass the integrity check.

22. A decoder for decoding an encoded data frame including dummy bit sequences each generated from encoding a predetermined bit pattern, the decoder comprising:
- a boundary detecting module, configured to determine a boundary of dummy bit sequences in the encoded data frame by:
  - determining an ideal dummy bit sequence corresponding to the predetermined bit pattern;

obtaining a soft decision value of each bit in the encoded data frame;

obtaining a plurality of soft correlation values according to the ideal dummy bit sequence and a plurality of soft decision values of the encoded data frame; and monitoring the soft correlation values to determine the boundary;

a decoding module, coupled to the boundary detecting module, the decoding module configured to decode encoded bits beyond the boundary according to the predetermined bit pattern to generate a partial decoding result; and a control module, coupled to the boundary detecting module and the decoding module, the control module configured to generate a decoded data frame according to the partial decoding result and a plurality of predetermined bit patterns each corresponding to one of the dummy bit sequences within the boundary.

23. A decoder for decoding an encoded data frame including dummy bit sequences each generated from encoding a predetermined bit pattern, the decoder comprising:

a boundary detecting module, configured to determine a boundary of dummy bit sequences in the encoded data frame by:

determining an ideal dummy bit sequence corresponding to the predetermined bit pattern;

obtaining a hard decision value according to a soft decision value of each bit in the encoded data frame;

obtaining a plurality of hard correlation values according to the ideal dummy bit sequence and a plurality of hard decision values of the encoded data frame; and monitoring the hard correlation values to determine the boundary;

a decoding module, coupled to the boundary detecting module, the decoding module configured to decode encoded bits beyond the boundary according to the predetermined bit pattern to generate a partial decoding result; and a control module, coupled to the boundary detecting module and the decoding module, the control module configured to generate a decoded data frame according to the partial decoding result and a plurality of predetermined bit patterns each corresponding to one of the dummy bit sequences within the boundary.

24. A decoder for decoding an encoded data frame including dummy bit sequences each generated from encoding a predetermined bit pattern, the decoder comprising:

a boundary detecting module, configured to determine a boundary of dummy bit sequences in the encoded data frame by:

determining an ideal dummy bit sequence corresponding to the predetermined bit pattern;

obtaining a soft decision value of each bit in the encoded data frame;

obtaining hard decision values according to a plurality of soft decision values of the encoded data frame;

obtaining a plurality of soft correlation values according to the ideal dummy bit sequence and the soft decision values of the encoded data frame;

obtaining a plurality of hard correlation values according to the ideal dummy bit sequence and the hard decision values of the encoded data frame; and monitoring the soft correlation values and the hard correlation values to determine the boundary;

a decoding module, coupled to the boundary detecting module, the decoding module configured to decode encoded bits beyond the boundary according to the predetermined bit pattern to generate a partial decoding result; and a control module, coupled to the boundary detecting module and the decoding module, the control module configured to generate a decoded data frame according to the partial decoding result and a plurality of predetermined bit patterns each corresponding to one of the dummy bit sequences within the boundary.

\* \* \* \* \*